(12) United States Patent
Munding

(10) Patent No.: US 9,653,671 B2
(45) Date of Patent: May 16, 2017

(54) LIGHT EMITTING DEVICE AND METHOD FOR OPERATING A PLURALITY OF LIGHT EMITTING ARRANGEMENTS

(71) Applicant: Infineon Technologies AG, Neubiberg (DE)

(72) Inventor: Andreas Munding, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 132 days.

(21) Appl. No.: 14/179,630

(22) Filed: Feb. 13, 2014

(65) Prior Publication Data
US 2015/0228878 A1    Aug. 13, 2015

(51) Int. Cl.
*H01L 29/18* (2006.01)
*H01L 33/64* (2010.01)
*H01L 27/15* (2006.01)
*H01L 33/62* (2010.01)
(Continued)

(52) U.S. Cl.
CPC .......... *H01L 33/644* (2013.01); *H01L 25/167* (2013.01); *H01L 27/15* (2013.01); *H01L 33/62* (2013.01); *H05B 33/0821* (2013.01); *H01L 33/641* (2013.01); *H01L 2224/32145* (2013.01);
(Continued)

(58) Field of Classification Search
CPC ......... H01L 27/15; H01L 33/62; H01L 33/64; H01L 25/167
USPC ........ 315/185 R, 186, 192, 200 R, 210, 291; 257/88
See application file for complete search history.

(56) References Cited

U.S. PATENT DOCUMENTS

| 6,380,578 B1* | 4/2002 | Kunikiyo | ............... H01L 21/84 257/296 |
| 8,575,642 B1* | 11/2013 | Shum | ...................... H01L 33/44 257/98 |
| 2002/0094615 A1 | 7/2002 | Kunikiyo | |

(Continued)

FOREIGN PATENT DOCUMENTS

| CN | 102003640 A | 4/2011 |
| DE | 102007045540 A1 | 4/2009 |
| WO | 2013016122 A1 | 1/2013 |

OTHER PUBLICATIONS

Seoul Semiconductor, Acrich 2 Bloc Meeting, Oct. 2011, 17 Pages.
(Continued)

*Primary Examiner* — Tung X Le
(74) *Attorney, Agent, or Firm* — Viering, Jentschura & Partner mbB

(57) ABSTRACT

According to various examples, systems, methods, and devices for a light emitting device are described herein. As one example, a light emitting device includes a light emitting element and a capacitor. The capacitor is configured as a voltage buffer for the light emitting element and is further configured to dissipate heat from the light emitting element. According to another example, a carrier for a light emitting arrangement is described herein. According to this example, the carrier includes a capacitor configured to buffer a voltage of the light emitting arrangement. The carrier further includes a contacting structure configured for electrically contacting the light emitting arrangement and the capacitor. The capacitor and the contacting structure are arranged such that the capacitor is configured to dissipate heat from the light emitting arrangement.

22 Claims, 4 Drawing Sheets

(51) Int. Cl.
*H05B 33/08* (2006.01)
*H01L 25/16* (2006.01)
(52) U.S. Cl.
CPC ............... *H01L 2224/48091* (2013.01); *H01L 2224/73265* (2013.01)

(56) References Cited

U.S. PATENT DOCUMENTS

| | | | |
|---|---|---|---|
| 2007/0284598 A1* | 12/2007 | Shakuda | H01L 27/156 257/93 |
| 2010/0201284 A1 | 8/2010 | Kraus | |
| 2010/0270935 A1* | 10/2010 | Otake et al. | 315/185 R |
| 2011/0050111 A1 | 3/2011 | Tanaka et al. | |
| 2011/0133660 A1* | 6/2011 | Tomita et al. | 315/193 |

OTHER PUBLICATIONS

IPDIA, EMSC-Embedded & Wirebond Silicon Capacitor dated Mar. 1, 2012, 2 Pages.
Catherine Bunel, Laurent Lengigno, IPDIA, Silicon Capacitors with extremely heigh stability and reliability ideal for high temperature applications dated May 15, 2012, 4 Pages.

* cited by examiner

LIGHT EMITTING DEVICE AND METHOD FOR OPERATING A PLURALITY OF LIGHT EMITTING ARRANGEMENTS

TECHNICAL FIELD

Various embodiments relate generally to light emitting devices and to methods for operating a plurality of light emitting arrangements.

BACKGROUND

Light emitting elements, such as light emitting diodes (LEDs), may have operating voltages of less than 4 V. If they are to be supplied by line voltage (or mains voltage), they may need to be connected in series or be driven by switching power supplies. However, switching power supplies are complex and may introduce electromagnetic interference.

Light emitting elements, such as LEDs, may have very short turn-on times and turn-off times which may result in flicker when they are operated with alternating current or a pulse width modulated (PWM) current. Flicker may be reduced by a smoothing capacitor for the current. However, the smoothing capacitor may need to be rated at the line voltage and capacitors with a high capacity are required because of the low frequency of the line voltage. To keep costs low, electrolytic capacitors may be used as smoothing capacitors. However, electrolytic capacitors may have a limited lifetime, especially when they are operated at high temperatures, and may be difficult to miniaturize.

SUMMARY

According to one embodiment, a light emitting device is described herein. The light emitting device includes at least one light emitting element and at least one capacitor. The at least one capacitor is configured as a voltage buffer for the at least one light emitting element. The at least one capacitor is further configured to dissipate heat from the at least one light emitting element.

According to another embodiment, a carrier for a light emitting arrangement is described herein. The light emitting arrangement includes a capacitor and a contacting structure. The capacitor is configured to buffer a voltage of the light emitting arrangement. The contacting structure is configured for electrically contacting the light emitting arrangement. The capacitor is electrically coupled to the contacting structure. The capacitor and the contacting structure are arranged such that the capacitor is configured to dissipate heat from the light emitting arrangement.

Further, according to another example, a method for operating a plurality of light emitting elements is described herein. The method includes controlling at least one light emitting element to output light. The method further includes using one or more capacitors coupled to the at least one light emitting element to smooth the light output by the at least one light emitting element. The method further includes using the one or more capacitors to dissipate heat generated by the at least one light emitting element away from the at least one light emitting element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components.

In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1A:
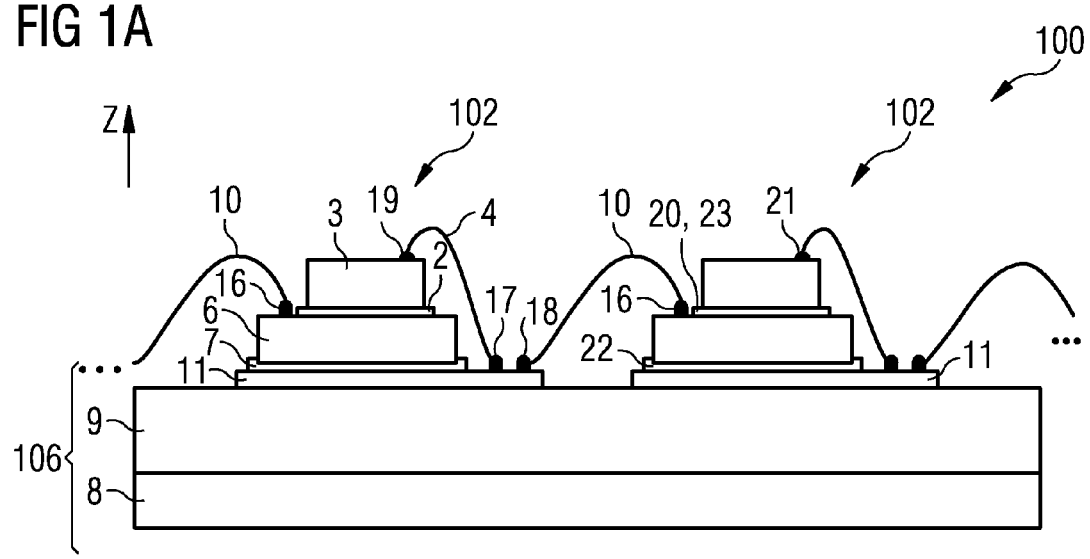
FIGS. 1A to 1D show an embodiment which may be part of a lighting system, where the light emitting device is arranged on the capacitor.

FIG. 1A shows an embodiment 100 which may be part of a lighting system. The lighting system may include a plurality of light emitting devices 102. For the sake of clarity, the embodiment 100 shows only two light emitting devices 102. However, any number of light emitting devices 102 may be used. Again for the sake of clarity, reference signs are spread out over the two light emitting devices 102 shown instead of labeling all elements of the light emitting devices 102 with the same reference signs.

The light emitting devices 102 may be electrically connected in series. The series connection of the plurality of light emitting devices 102 may be coupled to a rectified line voltage. The line voltage may for example be rectified by a half-wave rectifier or a full-wave rectifier. The number of light emitting devices 102 may be chosen by dividing the maximum rectified line voltage, for example 110 V or 230 V, minus the voltage drop of the rectifier by an operating voltage of the light emitting device, for example 1.6 V to 4.4 V. For example, for a 230 V line voltage, 86 LEDs each with an operating voltage of 2.5 V may be connected in series across the rectified line voltage. In this manner, no down-converter or switching power supply for the line voltage is required for operating the light emitting devices 102.

Figure 1B:
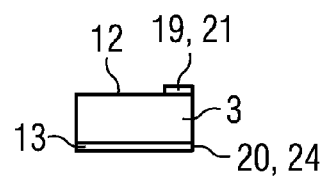
Figure 1C:
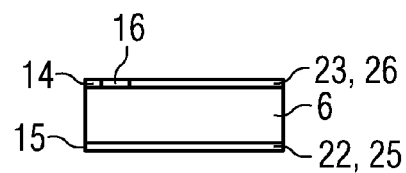

A light emitting device 102 may include a light emitting arrangement 3 and a capacitor 6. For better illustration, the light emitting arrangement 3 and the capacitor 6 are shown separately in FIG. 1B and FIG. 1C, respectively.

In various embodiments, the emitting arrangement 3 may be a single light emitting element. The light emitting element may be a light emitting diode (LED). However, the light emitting element may be any device that emits electromagnetic radiation, visible or invisible for the human eye. In various embodiments, the light emitting arrangement 3 may include a plurality of light emitting elements. The light emitting elements may be connected in series, as is for example illustrated in FIGS. 4A to 4C, to form the light emitting arrangement 3. However, the light emitting elements may also be electrically connected in other ways, such as a combination of parallel connections and serial connections.

The light emitting arrangement 3 may have a first terminal 20 and a second terminal 21. The first terminal 20 may be in the form of a metallization layer 24 on a first side 13, for example on the backside of the light emitting arrangement 3. The second terminal 21 may be in the form of a bond pad 19 on a second side 12 of the light emitting arrangement 3. The second side 12 may be opposite to the first side 13 and may be a light emitting side, that is, a side from which electromagnetic radiation is emitted from. However, the first and second terminals 20, 21 may also be implemented in different ways. For example, they may be on the same side of the light emitting arrangement 3.

The capacitor 6 may be configured as a voltage buffer for the light emitting arrangement 3. In other words, the capacitor 6 may be a smoothing capacitor for the voltage used for operating the light emitting arrangement 3. The capacitor 6 may supply the light emitting arrangement 3 with current during zero-crossings or between pulses of a PWM current source. In this manner, flicker of the light emitting arrangement 3 may be reduced. In various embodiments, the capacitor 6 may be electrically connected in parallel to the light emitting arrangement 3. The capacitor 6 is therefore only required to withstand the voltage needed for operating the light emitting arrangement 3, which may be between 1.6 V and 4.4 V. Consequently, the capacitor does not have to withstand the voltage of the line voltage.

The capacitor 6 may have a first terminal 22 and a second terminal 23. The first terminal 22 may be in the form of a metallization layer 25 on a first side 15 of the capacitor 6. The second terminal 23 may be in the form of a metallization layer 26 on a second side 14 of the capacitor 6. The second side 14 may be opposite to the first side 15. However, the first and second terminals 22, 23 may also be implemented in different ways. For example they may be on the same side, see for example FIG. 2C.

The capacitor 6 may be configured to dissipate heat from the light emitting arrangement 3. It may operate similarly to a heat sink, which is a well known metallic structure that is specifically configured to dissipate heat from one or more electronic components, for the light emitting arrangement 3, for example by placing the capacitor 6 in proximity of the light emitting arrangement 3. The word "proximity" may indicate that the capacitor 6 should be placed as close as possible to the light emitting arrangement 3 in order to maximize heat transfer from the light emitting arrangement 3 to the capacitor 6.

In various embodiments, the capacitor 6 may be placed directly below the light emitting arrangement 3. In other words, the light emitting arrangement 3 and the capacitor 6 may overlap when looking at the embodiment 100 along a direction Z. Direction Z may be perpendicular to one of the connection structures 11 in the first metallization 1, the substrate 9 and the substrate carrier 8, which are described in more detail below. In various embodiments, the capacitor 6 may overlap all of the light emitting arrangement 3. Consequently, heat emitted by the light emitting arrangement 3, for example in the negative Z-direction, may be conducted away by the capacitor 6. The capacitor 6 may have a higher thermal conductivity than the substrate 9 and may therefore conduct heat away from the light emitting arrangement 3 more efficiently than a substrate 9 without a capacitor 6 arranged in proximity of the light emitting arrangement 3. By acting as a heat sink, the capacitor 6 not only reduces flicker of the light emitting arrangement 3 but also removes heat generated by the light emitting arrangement 3. The light emitting arrangement 3 may therefore be driven with higher power to provide more light. Or, if the power with which the light emitting arrangement 3 is driven is kept the same, the life span of the light emitting arrangement 3 may be increased.

In various embodiments, the light emitting arrangement 3 may be mechanically fixed to capacitor 6 via an adhesive 2, for example a die-attach glue. The adhesive 2 may be a thermally conductive glue, so that heat can be transferred more efficiently from the light emitting arrangement 3 to the capacitor 6. In various embodiments, the light emitting arrangement 3 may be mechanically fixed to capacitor 6 via solder.

In various embodiments, the adhesive 2 may be electrically conductive and may electrically connect the first terminal 20 on the first side 13 of the light emitting arrangement 3 to the second terminal 23 on the second side 14 of the capacitor 6. In this way, no additional electrical connection is required. However, the first terminal 20 of the light emitting arrangement 3 and the second terminal 23 of the capacitor 6 may also be connected mechanically and electrically in other ways, for example via a solder.

The metallization 26 on the second side 14 of the capacitor 6 may be formed to have a bond pad 16 for a bond wire 10. Bond pad 16 may be part of the metallization 26 on the second side 14 of the capacitor 6. The bond wire 10 may be used to connect the light emitting device 102 to another light emitting device 102. For example, the light emitting device 102 on the right hand side of embodiment 100 may be connected by a bond wire 10 to the light emitting device 102 arranged to its left. In various embodiments, other interconnect technologies than bond wire may be used. For example, the light emitting devices 102 may be connected by structured plating.

The capacitor 6 may be arranged on a metallization layer 1. The metallization layer 1 may be arranged on a substrate 9 and may be patterned to provide electrical connecting structures 11 for the light emitting arrangements 3 and the capacitors 6. A respective connecting structure 11 may be provided for each light emitting device 102. The connecting structure 11 may be configured to electrically connect the respective light emitting arrangement 3 and the capacitor 6. They may further be configured to electrically couple light emitting arrangements 3 to one another, for example to connect them in electrically in series to each other, for example using bond wires 10.

Substrate 9 may be electrically insulating and may for example be a moldable or a flowable substance, such as a mold component, or be a printed circuit board (PCB) substrate. A side of the substrate 9 that is opposite to the side on which the metallization layer 1 is arranged on may have a metallization layer 8 arranged on it. However, layer 8 may also be a substrate carrier on which the substrate 9 is arranged on. The metallization layer 1, the second metallization layer (or substrate carrier) 8 and the substrate 9 arranged between these may form a carrier 106 for light emitting devices 102.

The capacitor 6 may be mechanically fixed to the connecting structure 11 via an adhesive 7, for example a die-attach glue. The adhesive 7 may be electrically conductive and may electrically connect the first terminal 22 on the first side 15 of the capacitor 6 to the connecting structure 11. The adhesive 7 may be thermally conductive and may conduct heat from the capacitor 6 to the connecting structure 11. In various embodiments, the capacitor 6 may be mechanically fixed to the connecting structure 11 via solder.

The connecting structure 11 may include a first bond pad 17 which may be electrically connected to the connecting structure 11. The first bond pad 17 may be electrically coupled to the bond pad 19 on the second side 12 of the light emitting arrangement 3, for example via a bond wire 4. The connecting structure 11 may include a second bond pad 18 which may be electrically connected to the connecting structure 11. The second bond pad 18 may be electrically coupled to the bond pad 16 on the second side 14 of the capacitor 3 of another light emitting device 102, for example via a bond wire 10. In various embodiments, other interconnect technologies than bond wire may be used. For example, the light emitting devices 102 may be connected by structured plating.

The parallel connection of the light emitting arrangement 3 and the capacitor 6 may form a light emitting device 102. A plurality of light emitting devices 102 may be connected electrically in series with each other, for example via bond wires 10.

Figure 1D:
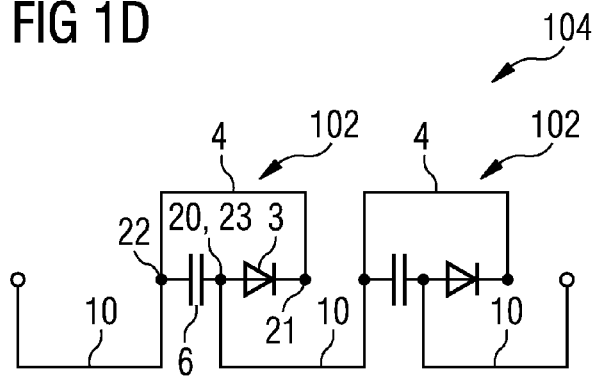

FIG. 1D shows an equivalent circuit 104 of the embodiment 100. The equivalent circuit 104 shows that the light emitting arrangement 3, which is represented by the symbol of a diode, is electrically connected in parallel to capacitor 6.

The first terminal 20 of the light emitting arrangement 3 may be connected to the second terminal 23 of the capacitor 6, for example by electrically connecting the metallization layer 24 on the first side of the light emitting arrangement 3 to the metallization layer 26 on the second side 14 of the capacitor 6, for example via an electrically conductive adhesive 2 or via a solder connection.

The second terminal 21 of the light emitting arrangement 3 may be connected to the first terminal 22 of the capacitor 6, for example the via bond wire 4 connected to the first bond pad 17 of the connecting structure 11 and the electrically conductive adhesive 7.

In various embodiments, the capacitor 6 may be a silicon capacitor or Metal-Oxide-Semiconductor (MOS) capacitor. However, any other kind of capacitor may be used. For example, capacitor 6 may be a capacitor with a metal-oxide-metal structure. Silicon capacitors may be formed as trenches in a semiconductor substrate. The trenches may be formed using reactive ion etching (RIE). A layer of conducting n+ doped silicon, such as poly-silicon, may be formed on the surface of the trenches to form a first electrode of the capacitor. A thin dielectric, for example an insulating oxide-nitrite-oxide (ONO) layer, may be formed on the first electrode to form the dielectric of the capacitor. Another conducting layer of n+ doped silicon, such as poly-silicon, may be formed on the dielectric to form a second electrode of the capacitor. Instead of poly-silicon, the first and second electrode may be made of metal. The trenches may be arranged in arrays and connected in parallel to increase the capacity of the capacitor.

Silicon capacitor may have a low profile, for example they may have a thickness between 70 μm and 120 μm. They may therefore be easily embedded, for example in a carrier.

Silicon capacitors may withstand high temperature, for example up to 150° C., with very good stability of capacitance and slow aging. They may therefore be used as a heat sink, for example for light emitting devices, such as LEDs.

Silicon capacitors may have a high capacitance density, that is, a large capacitance to volume or area ratio, for example of 100 nF/mm$^2$ and higher. With the emerging use of high-k dielectrics, even higher capacitance densities will be available. They may therefore be used for miniaturization. As an example, a cluster of 86 LEDs arranged on a spotlight with a diameter of 12 mm may be provided with a total capacity of up to 10 μF.

Silicon capacitors, for example with high capacitance density, may have electrical breakdown voltages between about 10 to 50 V, for example 20 V. However, an electrical breakdown voltage higher than that may not be necessary if the capacitor is connected in parallel to one of the light emitting arrangements connected in series as the voltage across the capacitor may be less than the line voltage divided by the number of light emitting arrangements.

Capacitor 6 may be a single capacitor, a series connection of capacitors, a parallel connection of capacitors, or a combination of at least one series connection of capacitors and at least one parallel connection of capacitors.

Figure 2A:
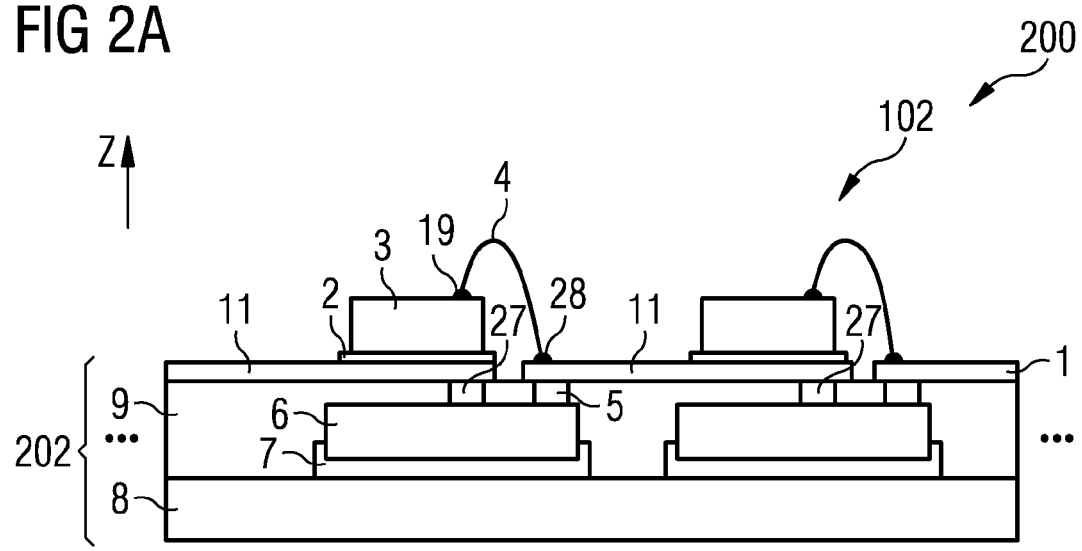
FIGS. 2A to 2D show an embodiment which may be part of a lighting system, where the capacitor is integrated in a carrier.
Figure 2B:
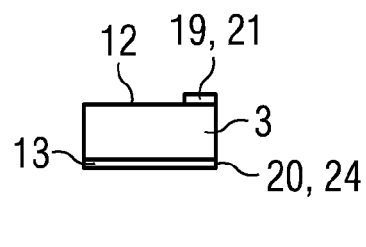
Figure 2C:
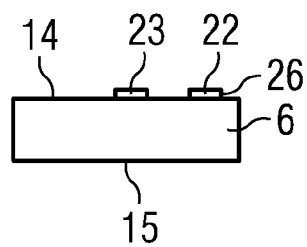

FIG. 2A shows an embodiment 200 which may be part of a lighting system. For better illustration, the light emitting arrangement 3 and the capacitor 6 are again shown separately in FIGS. 2B and 2C, respectively.

Embodiment 200 may be similar to embodiment 100 described in conjunction with FIGS. 1A to 1D, so that the features described there may also apply here. However, there may be differences.

In contrast to embodiment 100, the light emitting arrangement 3 may be arranged on the connecting structure 11 in the metallization layer 1 instead of on the capacitor 6. In various embodiments, the light emitting arrangement 3 may be mechanically fixed to the connecting structure 11 via an adhesive 2, for example a die-attach glue. The adhesive 2 may be electrically conductive and may electrically connect the first terminal 20 on the first side 13 of the light emitting arrangement 3 to the connecting structure 11. In various embodiments, the light emitting arrangement 3 may be mechanically fixed to the connecting structure 11 via solder.

In various embodiments, the capacitor 6 may again be a silicon capacitor. It may again be configured as a heat sink for the light emitting arrangement 3, for example by arranging the capacitor 6 in proximity of the light emitting arrangement 3. The word "proximity" may indicate that the capacitor 6 should be placed with respect to the light emitting arrangement 3 so that heat transfer from the light emitting arrangement 3 to the capacitor 6 is maximized. For example, the capacitor 6 may be placed in the substrate 9 below the light emitting arrangement 3, that is, the light emitting arrangement 3 and the capacitor 6 may overlap when viewed along the Z-direction. In various embodiments, the capacitor 6 may overlap all of the light emitting arrangement 3. To further improve the heat transfer from the light emitting arrangement 3, the capacitor 6 may be placed as close as possible in Z-direction to the first metallization 1. In this way, the amount of substrate 9, which may have a lower thermal conductivity, between the first light emitting arrangement and the capacitor 6 may be reduced or even eliminated.

In contrast to FIGS. 1A to 1D, the first metallization 1 and some of the substrate 9 may be arranged between the light emitting arrangement 3 and the capacitor 6, which may lead to a higher thermal resistance. However, heat conduction may still be improved in comparison to a substrate 9 without the capacitor 6 as the capacitor 6 may have a higher thermal conductivity than the substrate 9 and may therefore conduct more heat away from the light emitting arrangement 3 then a substrate 9 alone.

In various embodiments, the light emitting arrangement 3 and the capacitor 6 may be electrically connected by first via 27. The first via 27 may reduce the thermal resistance between the light emitting arrangement 3 and the capacitor 6. The first via 27 may have a high thermal conductivity. It may, for example, be a thermal via and may be placed between the light emitting arrangement 3 and the capacitor 6.

In various embodiments, the adhesive 2 used for mechanically fixing the light emitting arrangement 3 to the connecting structure 11 may be may be a thermally conductive glue, so that heat may be transferred more efficiently from the light emitting arrangement 3 to the capacitor 6.

The capacitor 6 may again have a first terminal 22 and a second terminal 23. However, the first terminal 22 and second terminal 23 may be on the same side of the capacitor 6, for example on the second side 14. The first terminal 22 and second terminal 23 may be formed or patterned in the metallization layer 26 on the second side 14 of the capacitor 6.

In various embodiments, capacitor 6 may be located in the substrate 9 instead of being arranged on the metallization layer 1. In various embodiments, capacitor 6 may be mechanically fixed to the carrier substrate 8, for example via an adhesive 7, for example a die-attach glue. The adhesive 7 may be a thermally conductive glue, so that heat can be transferred more efficiently from the capacitor 6 to the carrier substrate 8. The adhesive 7 does not need to be electrically conductive.

A respective light emitting device 102 may have a respective connecting structure 11. The respective connecting structure 11 may electrically be coupled to a first via 27 and a second via 5. The first via 27 may electrically connect the first terminal 20 on the first side 13 of the light emitting arrangement 3 via the respective connecting structure 11 to the second terminal 23 on the second side 14 of the capacitor 6 of the respective light emitting device 102. The second via 5 may electrically connect the first terminal 22 on a second side 14 of a capacitor 6 of another, for example neighboring, light emitting device 102.

The connecting structure 11 may include a bond pad 28. The bond pad 28 may be electrically coupled to the connecting structure 11. The bond pad 28 may be electrically coupled to the bond pad 19 on a second side 12 of a light emitting arrangement 3 of another, for example neighboring, light emitting device 102, for example via a bond wire 4. The connecting structure 11 may be used to electrically connect the light emitting device 102 to another light emitting device 102 in series.

Figure 2D:
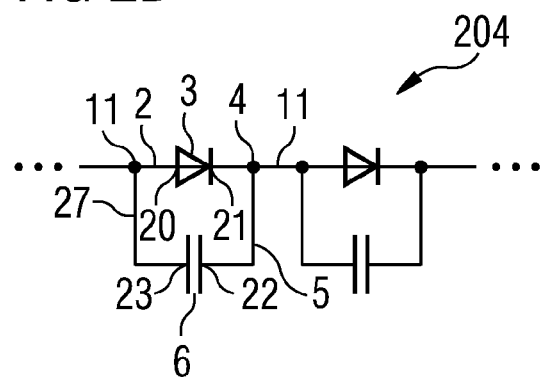

FIG. 2D shows an equivalent circuit 204 of embodiment 200. The equivalent circuit 204 may have a light emitting arrangement 3, which is represented by the symbol of a diode, that is electrically connected in parallel to a capacitor 6.

The first terminal 20 of the light emitting arrangement 3 may be connected to the second terminal 23 of the capacitor 6, for example via the electrically conductive adhesive 2, the connection structure 11 on which the light emitting arrangement 3 is arranged on, and the first via 27.

The second terminal 21 of the light emitting arrangement 3 may be connected to the first terminal 22 of the capacitor 6, for example via bond wire 4, the bond pad 28 on the connection structure 11 on which a neighboring light emitting arrangement 3 is arranged on, and the second via 5. A neighboring light emitting arrangement 3 may be a light emitting arrangement 3 that is arranged directly adjacent, that is without intermitting light emitting arrangements 3, to another light emitting arrangement 3. It may be the light emitting arrangement 3 that is connected electrically in series closest to the light emitting arrangement 3. Thus, the connecting structure 11 of one light emitting arrangement 3 may be used to couple or connect the capacitor 6 of another light emitting arrangement 3.

The parallel connection of the light emitting arrangement 3 and the capacitor 6 may form a light emitting device 102. A plurality of a light emitting devices 102 may be connected electrically in series with each other, for example via a respective connecting structure 11 electrically coupled to another respective connecting structure 11. The another respective connecting structure 11 may electrically connect the first terminal 22 of capacitor 6, for example via second via 5, and may electrically connect a second terminal 20 of the light emitting arrangement 3, for example via bond wire 4, to the first terminal 20 of its light emitting arrangement 3, for example via a conductive adhesive 2 and to a second terminal 23 of its capacitor 6, for example via a first via 27.

The embodiment 200 may also be described in terms of a carrier 202. The carrier 202 may be configured in such a way that a light emitting system can be obtained by fixing and electrically connecting the light emitting arrangements 3 to the carrier 202. In various embodiments, one or more light emitting arrangements 3 may be arranged or fixed on the carrier 202, for example by using conductive adhesive 2 or by soldering. For each light emitting arrangement 3, the carrier 202 may include a respective capacitor 6 and a respective contacting structure 11. The respective capacitors 6 may be configured to buffer a voltage of the respective light emitting arrangement 3. The respective contacting structure 11 may be configured for electrically contacting the respective light emitting arrangement 3, for example by providing pads for electrically conducting adhesive, for wire bonding or soldering. The respective capacitor 6 may be electrically coupled to the respective contacting structure 11. The respective capacitor 6 and the respective contacting structure 11 may be arranged such that the capacitor 6 forms a heat sink for the respective light emitting arrangements 3.

In various embodiments, the respective contacting structure 11 may be configured to electrically couple the respective capacitor 6 in parallel to the respective light emitting arrangement 3. In various embodiments, the respective contacting structure 11 may be formed in the metallization layer 1. In various embodiments, the respective capacitor 6 may be coupled to the respective contacting structure 11 by at a first via 27 and may be coupled to another contacting structure 11 by a second via 5. In various embodiments, the vias 5, 27 may be thermal vias, that is, vias that are designed to have a low thermal resistance. In various embodiments, capacitor 6 may be electrically connected to the light emitting arrangement 3 via the contacting structure 11.

In various embodiments, the carrier may include a substrate carrier 8. The capacitor 6 may be arranged or fixed on the substrate carrier 8, for example via an adhesive 7. The capacitor 6 may be laminated onto the substrate carrier 8, for example by placing a foil over the capacitor 6 and the substrate carrier 8 and exerting pressure or temperature or both on the foil. The foil may form the substrate 9. However, other methods are possible to embed the capacitor 6 in a substrate 9 between the metallization layer 1 (or connection structure 11) and the substrate carrier 8.

In various embodiments, the carrier 202 may further include a rectifying unit embedded in the carrier 202, for example between the substrate carrier 8 and the contacting structure 11. The rectifying unit may rectify a line voltage, for example 110 V or 230 V. The rectifying units does not require a smoothing capacitor as the light emitting arrangements 3 may be electrically connected in parallel to respective capacitor 6 that act as smoothing capacitors.

In various embodiments, the carrier 202 may further include a control circuit embedded in the carrier 202, for example between the substrate carrier 8 and the contacting structure 11. The control circuit may be configured to control the light emitting arrangements 3, for example, to control the intensity or the color of the light emitted.

In various embodiments, the contacting structures 11 are coupled together such that the light emitting arrangements 3 are coupled electrically in series to each other. In various embodiments, the contacting structures 11 are patterned in the same metallization layer 1.

In various embodiments, the light emitting arrangement 3 may include one of the following: a light emitting element, and a plurality of light emitting elements electrically connected in series.

Carrier 202 may be used by a producer of light emitting arrangements 3 to produce lighting systems. The first terminal 20 of the light emitting arrangements 3 may be connected to the respective connecting structure 11, for example using a conductive adhesive or any kind of soldering, for example the kind that is used when mounting surface mounted devices (SMD), and the second terminal 21 of the light emitting arrangements 3 may be connected to the bond pad 28 on an adjacent connecting structure 11, for example by wire bonding. No extra connections are needed if the rectifier and the control unit are included in the carrier 202. The series connection of light devices 102 may be directly connected to mains voltage. As the capacitors 6 provide buffer voltages, flicker may be reduced, even at the low frequencies of the line voltage. Further, because the use of the capacitors 6 as heat sinks, an additional heat sink may not be necessary, which may simplify installation of the light system.

Figure 3A:
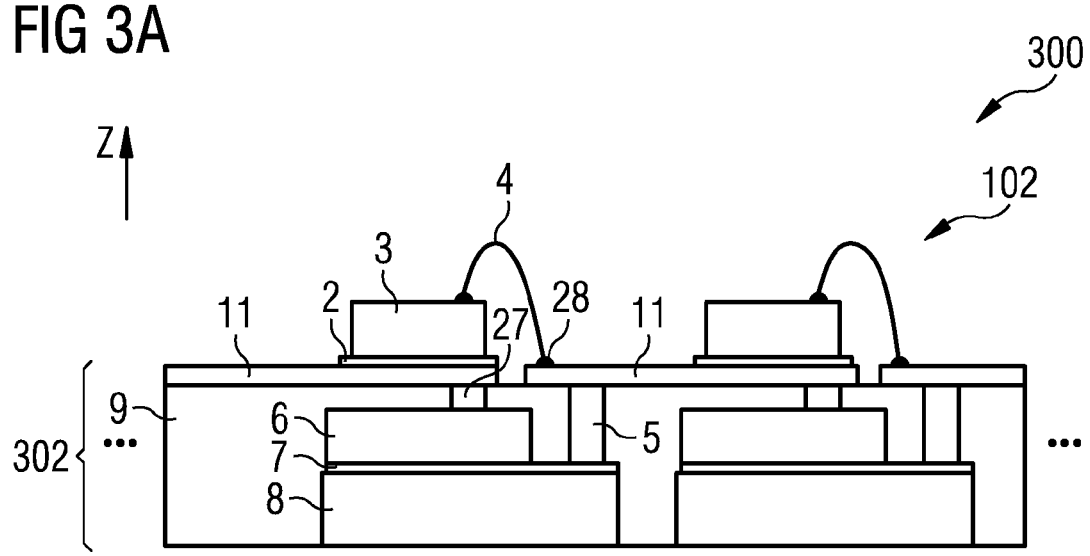
FIGS. 3A to 3D show another embodiment which may be part of a lighting system, where the capacitor is integrated in the carrier.
Figure 3B:
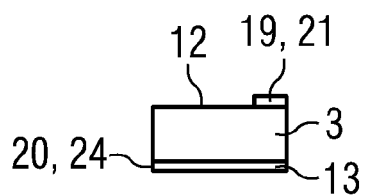
Figure 3C:
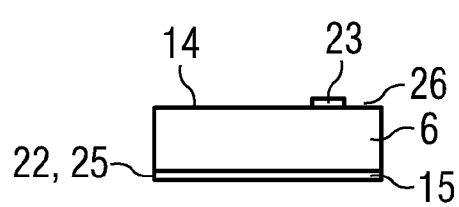

FIG. 3A shows an embodiment 300 which may be part of a lighting system. For better illustration, the light emitting arrangement 3 and the capacitor 6 are again shown separately in FIGS. 3B and 3C, respectively.

Embodiment 300 may be similar to embodiment 200 described in conjunction with FIGS. 2A to 2D, so that the features described there may also apply here. However, there may be differences.

The capacitor 6 may, for example, be a silicon capacitor. In contrast to embodiment 200, the capacitors 6 may have first terminals 22 and second terminals 23 on opposite sites 14, 15 of the capacitor 6, similar to FIGS. 1A to 1D.

The connecting structure 11 and the first via 27 may again electrically connect the first terminal 20 on the first side 13 of the light emitting arrangement 3 to the second terminal 23 on the second side 14 of the capacitor 6. The second via 5 may again be electrically connected to another connecting structure 11 and via bond pad 28 and bond wire 4 to the second side 12 of the light emitting arrangement 3.

In various embodiments, capacitor 6 may again be mechanically fixed to the carrier substrate 8, for example via an adhesive 7, for example a die-attach glue. The adhesive 7 may be a thermally conductive glue, so that heat can be transferred more efficiently from the capacitor 6 to the carrier substrate 8. However, to electrically connect the first terminal 22 on the first side 15 of the capacitor 6, the adhesive 7 may be electrically conductive. In various embodiments, the capacitor 6 may be mechanically fixed to the carrier substrate 8 via solder.

In various embodiments, the carrier substrate 8 may be made up of respective carrier substrates 8 that are electrically insulated from each other. A respective carrier substrate 8 may be provided for each light emitting device 102. The carrier substrate 8 may be an insulator. It may have a metallization on the side on which the capacitor 6 is arranged on. The metallization may be electrically connected to the first terminal 22 of the capacitor 6 via the adhesive 7. The metallization may extend along the carrier substrate 8 to the second via 5 and may be electrically connected to the second via 5. In various embodiments, the respective carrier substrate 8 may be electrically conductive so that no metallization is required.

In various embodiments, a common carrier substrate 8 may be used for more than one or all of the light emitting devices 102. A metallization may be arranged on the common carrier substrate 8. The metallization may be patterned to provide respective metallizations for the light emitting devices 102, where the respective metallizations are insulated from each other.

Again, a respective capacitor 6 may be configured as a heat sink for a respective light emitting arrangement 3, for example by placing the respective capacitor 6 in proximity of, for example directly below, the respective light emitting arrangement 3.

The embodiment 300 may also be described in terms of a carrier 302. The carrier 302 may be configured in such a way that a light emitting system can be obtained by connecting the light emitting arrangements 3 electrically to the carrier 302, for example by means of a conductive adhesive 2 or a surface mounting technology (SMT). Carrier 302 may be similar to carrier 202 described in conjunction with FIGS. 2A to 2D, so that the features described there may also apply here. However, there may be differences.

In various embodiments, the carrier 302 may again carry one or more light emitting arrangements 3 and may include respective capacitors 6 and respective contacting structure 11. The respective contacting structure 11 may again be configured to electrically couple the respective capacitor 6 in parallel to the light emitting arrangement 3.

However, in various embodiments, the carrier 302 may include a respective substrate carrier 8 for each light emitting arrangement 3 instead of a substrate carrier 8 for all of the light emitting arrangements 3, as described for embodiment 200 in conjunction with FIGS. 2A to 2D. The respective substrate carrier 8 may be conductive or have a conducting metallization on its side facing the respective capacitor 6. The respective capacitor 6 may be arranged or fixed on the respective substrate carrier 8, for example via a conductive adhesive 7 or by soldering.

Again, the capacitors 6 may be arranged in the carrier 302 and the contacting structure 11 may be arranged on the carrier 302 such that the capacitors 6 form heat sinks for the respective light emitting arrangement 3.

Figure 3D:
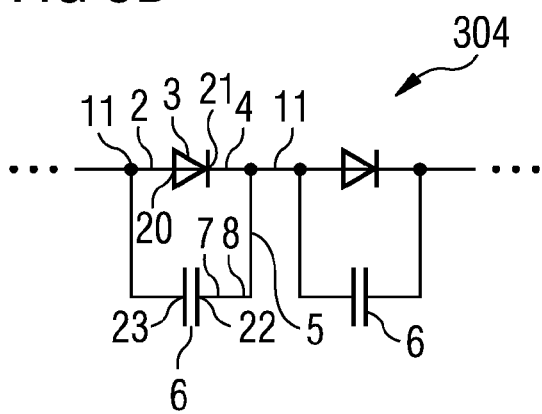

FIG. 3D shows an equivalent circuit 304 of the embodiment 300. The equivalent circuit 304 may have light emitting arrangements 3, which are represented by the symbol of diodes, electrically connected in parallel to respective capacitors 6. The description may be the same as for the equivalent circuit 204 except that the second via 5 does not directly contact the first terminal 22 of the capacitor 6. Instead, the first terminal 22 is contacted via the substrate carrier 8 and the electrically conducting adhesive 7.

Again, the parallel connection of the light emitting arrangement 3 and the capacitor 6 may faint a light emitting device 102 and a plurality of a light emitting devices 102 may be connected electrically in series with each other.

Figure 4A:
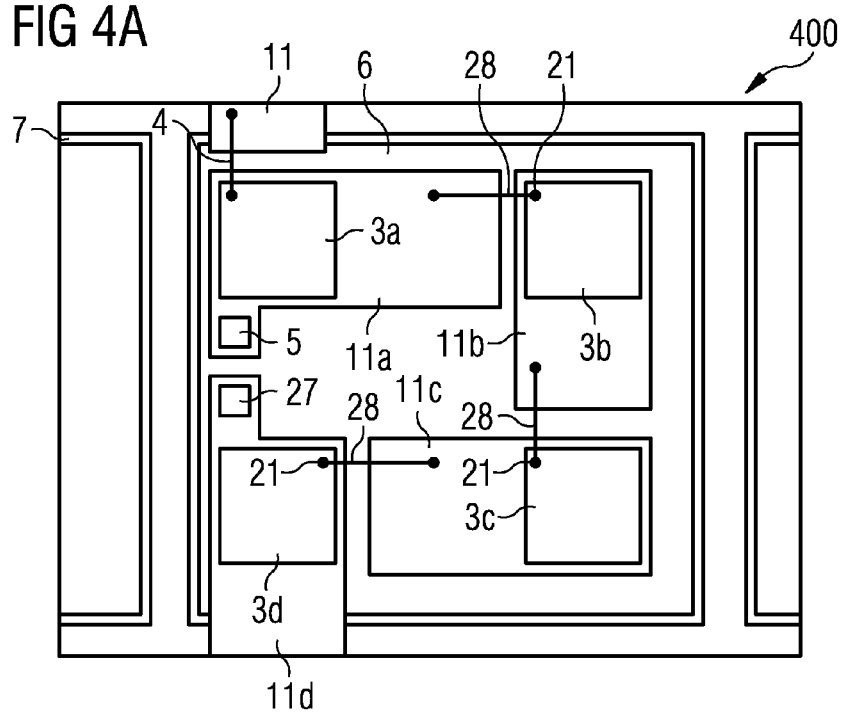
FIGS. 4A to 4C show an embodiment which may be part of a lighting system, with several light emitting elements.
Figure 4B:
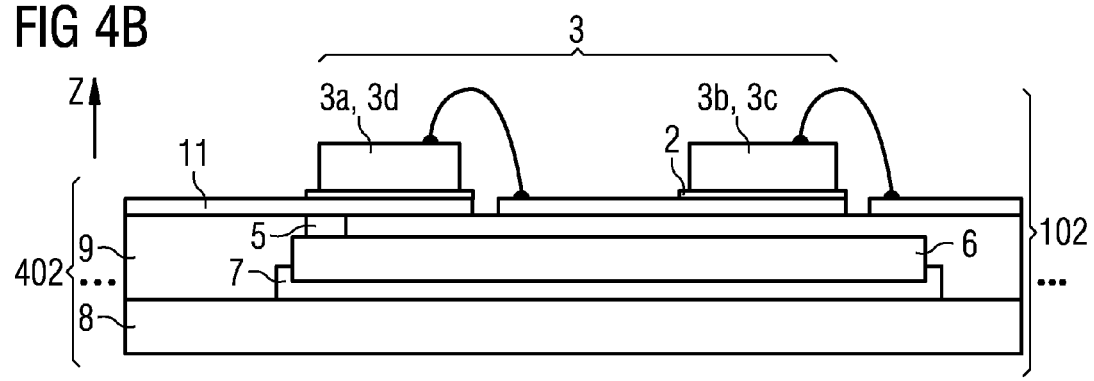

FIG. 4A shows a top view and FIG. 4B shows a cross section view of an embodiment 400 which may be part of a light emitting device 102 of a lighting system. Embodiment 400 shows a light emitting arrangement 3 including more than one light emitting element 3. While four light emitting elements 3 are shown, any number of light emitting element may be used. For example, two to ten light emitting elements 3 may be connected in series with each other. However, some or all of the light emitting elements may be made up of a parallel connection of light emitting elements.

The number of light emitting elements 3 may depend on the operating voltage of the light emitting elements 3 and the maximum allowable operating voltage of the capacitor 6. The maximum allowable operating voltage of the capacitor 6 may be higher than the sum of the operating voltages of the light emitting elements 3, that is higher than the operating voltage of the series connection of the light emitting elements 3.

Embodiment 400 may be similar to embodiment 200 described in conjunction with FIGS. 2A to 2D as the capacitor 6 has its first terminal 22 and second terminal 23 on the same side, so that the features described there may also apply here. However, embodiment 400 may also be similar to embodiment 300 described in conjunction with FIGS. 3A to 3D if the capacitor 6 has its first terminal 22 and second terminal 23 on opposite sides, so that the features described there may also apply here.

The light emitting arrangement 3 may include a plurality of light emitting elements 3, for example 3a, 3b, 3c and 3d, connected electrically in series to each other. The light emitting elements 3 may be LEDs. The light emitting elements 3a, 3b, 3c and 3d may be arranged on respective connection structure 11, for example 11a, 11b, 11c, and 11d. The respective connection structure 11 may electrically contact a first terminal 20 of the respective light emitting element 3, for example using a conductive adhesive 2 or a surface mounting technology. The respective connection structure 11 may further be electrically connected to a second terminal 21 of a light emitting element arranged on an adjacent connection structure 11, for example via bond wire 28. The term "adjacent" or "neighboring" may be used to describe the light emitting element that is next in the electrical series connection, or in other words, directly connected, to the light emitting element. For example, connection structure 11a is adjacent to connection structure 11b, connection structure 11b is adjacent to connection structure 11c, and connection structure 11c is adjacent to connection structure 11d.

In various embodiments, a first of the respective connection structure, for example connection structure 11a, may be electrically connected by a second via 5 to the first terminal 22 of the capacitor 6. A last of the respective connection structure, for example connection structure 11d, may be connected by a first via 27 to the second terminal 23 of the capacitor 6. It may be electrically connected, for example via another bond wire 4, to another light emitting device 102.

The series connection of the plurality of light emitting elements 3a, 3b, 3c and 3d may be connected to the capacitor 6. If the light emitting elements 3a, 3b, 3c and 3d are LEDs with an operating voltage of 2 V to 3 V, the capacitor 6 may only be required to withstand voltages of 8 V to 12 V instead of line voltage. The capacitor 6 may, for example, be a silicon capacitor. Further, the number of vias needed may be reduced by having only two vias for the series connection of the light emitting elements 3 instead of two vias for each light emitting element 3.

Each of the light emitting elements 3a, 3b, 3c and 3d may be placed on top of the capacitor 6. Again, the capacitor 6 may be configured as a heat sink for the light emitting arrangement 3, here made up of the four light emitting elements 3a, 3b, 3c and 3d, by placing the capacitor 6 in proximity of the light emitting arrangement 3, as described above. The heat produced by each light emitting element 3a, 3b, 3c and 3d may be transported away by the capacitor 6.

Again, the embodiment 400 may be described in terms of a carrier 402. As the carrier 402 is similar to carrier 202, the description of carrier 202 may also apply to carrier 402. However, the connecting structure 11 may include a plurality of connecting structures, for example four, for each light emitting element 3, for example light emitting elements 3a, 3b, 3c and 3d. The plurality of connecting structures may be configured for electrically connecting the light emitting elements 3. The plurality of connecting structures may be configured for an electrical series coupling or connection of the light emitting elements 3.

Figure 4C:
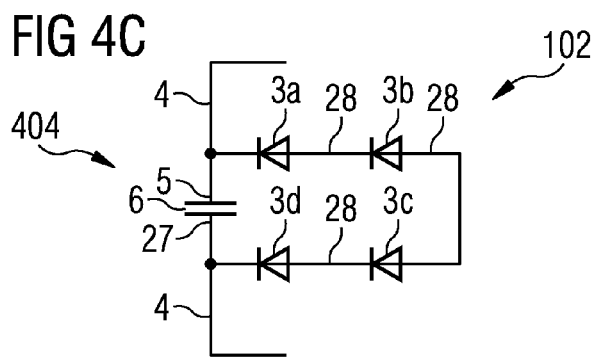

FIG. 4C shows an equivalent circuit 404 of the embodiment 400. The equivalent circuit 404 shows the series connection of the four light emitting elements 3a, 3b, 3c and 3d which are again represented by the symbol of a diode and form the light emitting arrangement 3. The four light emitting elements 3a, 3b, 3c and 3d may be connected in series by bond wires 28. The series connection may be electrically connected in parallel to capacitor 6 using vias 5, 27. Again, the parallel connection of the light emitting arrangement 3 and the capacitor 6 may form a light emitting device 102. A plurality of a light emitting devices 102 may be connected electrically in series with each other, for example using bond wires 4.

In various embodiments, a method for operating a plurality of light emitting arrangements 3 is presented. The method may be used for providing light without flicker. The method may include controlling at least one light emitting element to output light, for example by coupling the plurality of light emitting arrangements 3 in series to each other across a rectified line voltage; using one or more capacitors coupled to the at least one light emitting element to smooth the light output by the at least one light emitting element, for example by coupling respective capacitors 6 electrically in parallel to a respective light emitting arrangements 3; using the one or more capacitor to dissipate heat generated by the at least one light emitting element away from the at least one light emitting element, for example by conducting heat generated by the respective light emitting arrangements 3 away from the respective light emitting arrangement 3 by using the respective capacitor 6 as a heat sink. The respective capacitors 6 may act as voltage buffers as well as heat sinks for the respective light emitting arrangements 3 at the same time, thus reducing the operating temperatures of the respective light emitting arrangements 3 and providing light without flicker.

In various embodiments, the respective capacitors 6 may be embedded in a carrier and the respective light emitting arrangements 3 are arranged on the carrier. In various embodiments, the respective capacitors 6 may be silicon capacitor. In various embodiments, the respective light emitting arrangements 3 may be arranged so that heat generated by the respective light emitting arrangements 3 is conducted away by the respective capacitor 6. For example, the light emitting arrangements 3 may be arranged in proximity of the respective capacitors 6, for example as close as possible to the respective capacitors 6. For example, the respective light arrangement 3 may be arranged with the greatest possible overlap, for example 100%, with the respective capacitor 6 when viewed alone a direction perpendicular to a plane of the carrier. In various embodiments, the respective capacitors 6 may overlap all of or even more than the respective light arrangement 3. Using the view presented in FIG. 4A for illustration, the rectangle(s) representing the respective light arrangement 3 may be fully inside the rectangle representing the capacitor 6. The rectangle representing the capacitor 6 may be larger than the rectangle(s) representing the respective light arrangement 3.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light emitting device, comprising:
a carrier;
one or more light emitting elements disposed over the carrier; and
one or more capacitors disposed between the carrier and the one or more light emitting elements, wherein the one or more capacitors is configured as a voltage buffer for the one or more light emitting elements; and
wherein the one or more capacitors is further configured to dissipate heat away from the one or more light emitting elements.

2. The light emitting device of claim 1, wherein
the one or more light emitting elements comprises a plurality of light emitting elements;
wherein the one or more capacitors comprises a plurality of capacitors; and
wherein each capacitor of the plurality of capacitors is associated with one light emitting element and each capacitor is configured as a voltage buffer for each associated light emitting element of the one or more light emitting elements.

3. The light emitting device of claim 2, wherein
each of the plurality of capacitors is further configured to dissipate heat from each associated light emitting element of the one or more light emitting elements.

4. The light emitting device of claim 3, wherein
the one or more capacitors is mechanically and electrically connected to the one or more light emitting elements via at least one of:
a conducting adhesive glue; and
solder.

5. The light emitting device of claim 2, wherein
the one or more light emitting elements are connected to one another in series.

6. The light emitting device of claim 5, wherein
wherein the series connection of the one or more light emitting elements is coupled to a rectified line voltage.

7. The light emitting device of claim 1, wherein
the one or more capacitors is a silicon capacitor.

8. The light emitting device of claim 1, wherein
of the one or more capacitors is electrically connected to the one or more light emitting elements by a thermal via.

9. The carrier of claim 1, further comprising:
a rectifying unit arranged between the substrate carrier and the one or more contacting structures.

10. The carrier of claim 1, further comprising:
a control circuit configured to control the one or more light emitting arrangements, wherein the control circuit is arranged between the substrate carrier and the one or more contacting structures.

11. A carrier for one or more light emitting arrangements, comprising:
one or more capacitors disposed on the carrier and configured to buffer a voltage of the one or more light emitting arrangements; and
one or more contacting structures disposed over the one or more capacitors configured for electrically contacting the one or more light emitting arrangements;
wherein the one or more capacitors is electrically coupled to the one or more contacting structures; and
wherein the one or more capacitors and the one or more contacting structures is arranged such that the one or more capacitors is configured to dissipate heat away from the one or more light emitting arrangements.

12. The carrier of claim 11, wherein
the one or more capacitors is embedded in the carrier and the one or more light emitting arrangements is arranged on the carrier.

13. The carrier of claim 12, wherein
the one or more light emitting arrangements overlaps with the one or more capacitors when viewed along a direction perpendicular to a plane of the carrier.

14. The carrier of claim 11,
wherein the one or more contacting structures is configured to electrically couple the one or more capacitors in parallel to the one or more light emitting arrangements.

15. The carrier of claim 14,
wherein the one or more contacting structures comprises an electrically conducting adhesive or solder.

16. The carrier of claim 14,
wherein the one or more contacting structures comprises a metallization layer; and
wherein the one or more capacitors is coupled to the metallization layer by at least one via.

17. The carrier of claim 11,
wherein the one or more capacitors is a silicon capacitor.

18. The carrier of claim 11, wherein:
the one or more capacitors comprises a first capacitor and the one or more light emitting arrangements comprises a first light emitting arrangement, and
wherein the one or more capacitors comprises a second capacitor configured to buffer a voltage of a second light emitting arrangement of the one or more light emitting arrangements; and
wherein the one or more contacting structures comprises a first contacting structure and a second contacting structure configured for contacting the second light emitting arrangement; wherein
the second capacitor is electrically coupled to the second contacting structure; and
wherein
the second capacitor and the second contacting structure are arranged such that the second capacitor is configured to dissipate heat from the second light emitting arrangement.

19. The carrier of claim 18,
wherein the second contacting structure is configured to electrically couple the second capacitor in parallel to the second light emitting arrangement.

20. The carrier of claim 19,
wherein the first contacting structure and the second contacting structure are coupled together such that the first light emitting arrangement and the second light emitting arrangement are coupled electrically in series to each other.

21. The carrier of claim 20,
wherein the first contacting structure and the second contacting structure comprise a same metallization layer.

22. A method for operating a plurality of light emitting elements, comprising:
controlling one or more light emitting elements to output light;
using one or more capacitors coupled to the one or more light emitting elements to smooth the light output by the one or more light emitting elements; wherein the one or more light emitting elements are disposed over the one or more capacitors;
and wherein the one or more capacitors are disposed over a carrier; and
using the one or more capacitors to dissipate heat generated by the one or more light emitting elements away from the one or more light emitting elements.

* * * * *